US008519806B2

(12) United States Patent
Casset et al.

(10) Patent No.: US 8,519,806 B2
(45) Date of Patent: Aug. 27, 2013

(54) BULK-MODE RESONATOR HAVING AT LEAST PARTIALLY FILLED OPEN CAVITIES (75) Inventors: Fabrice Casset, Tencin (FR); Cédric Durand, Saint Martin D'heres (FR)

(73) Assignee: STMicroelectronics S.A., Montrouge (FR)

( * ) Notice: Subject to any disclaimer, the term of this patent is extended or adjusted under 35 U.S.C. 154(b) by 443 days.

(21) Appl. No.: 12/794,037

(22) Filed: Jun. 4, 2010

(65) Prior Publication Data

US 2011/0012693 A1 Jan. 20, 2011

(30) Foreign Application Priority Data

Jun. 8, 2009 (FR) ...................................... 09 53773

(51) Int. Cl.
*H03H 9/24* (2006.01)
*H03H 9/46* (2006.01)
*H03H 3/013* (2006.01)

(52) U.S. Cl.
USPC ........... 333/186; 333/187; 333/188; 310/312; 310/346

(58) Field of Classification Search
USPC ......... 333/186–188, 197, 199, 200; 310/312, 310/341, 346; 438/50–53
See application file for complete search history.

(56) References Cited

U.S. PATENT DOCUMENTS

| 6,557,419 B1 * | 5/2003 | Herb et al. ....................... 73/766 |
| 7,639,104 B1 * | 12/2009 | Quevy et al. .................. 333/186 |
| 7,847,649 B2 * | 12/2010 | Van Beek et al. ............. 331/154 |
| 7,889,030 B2 * | 2/2011 | Schoen et al. ................. 333/234 |
| 7,999,635 B1 * | 8/2011 | Quevy et al. .................. 333/186 |
| 2006/0186971 A1 * | 8/2006 | Lutz et al. ..................... 333/186 |
| 2007/0296527 A1 | 12/2007 | Lutz et al. |
| 2008/0284544 A1 | 11/2008 | Hashimura |
| 2009/0158566 A1 * | 6/2009 | Hagelin et al. ............... 29/25.35 |
| 2010/0319185 A1 * | 12/2010 | Ayazi et al. .................... 29/594 |

FOREIGN PATENT DOCUMENTS

WO     WO 2007/072409 A2 *  6/2007

OTHER PUBLICATIONS

French Search Report dated Jan. 18, 2010 from corresponding French Application No. 09/53773.
Bedair S.S., et al., Polymer Wicking to Mass Load Cantilevers for Chemical Gravimetirc Sensors, Solid-State Sensors, Actuators and Microsystems, 2005, Digest of Techn ICAL Papers, Transducers '05. The 13*th* International Conference on Seoul, Korea Jun. 5-9, 2005, Piscataway, NJ , USA, IEEE, vol. 2, Jun. 5, 2005, pp. 2035-2039, XP010828770.

* cited by examiner

*Primary Examiner* — Barbara Summons
(74) *Attorney, Agent, or Firm* — Wolf, Greenfield & Sacks, P.C.

(57) ABSTRACT

A method for forming a resonator including a resonant element, the resonant element being at least partly formed of a body at least partly formed of a first conductive material, the body including open cavities, this method including the steps of measuring the resonator frequency; and at least partially filling said cavities.

38 Claims, 4 Drawing Sheets

BULK-MODE RESONATOR HAVING AT LEAST PARTIALLY FILLED OPEN CAVITIES

CROSS REFERENCE TO RELATED APPLICATIONS

This application claims the priority benefit of French patent application number 09/53773, filed on Jun. 8, 2009, entitled "BULK-MODE RESONATOR," which is hereby incorporated by reference to the maximum extent allowable by law.

BACKGROUND OF THE INVENTION

1. Field of the Invention

The present invention relates to bulk-mode resonator structures and manufacturing methods.

2. Discussion of the Related Art

To form time bases, many circuits use quartz oscillators. Such oscillators have a high quality factor on the order of 100,000 and a temperature-stable resonance frequency. They however have the disadvantage of a resonance frequency range limited to values below some hundred megahertz, typically 30 MHz. Further, they are difficult to integrate in a same assembly as electronic circuits formed in a semiconductor substrate.

To reach higher frequencies and decrease power consumption levels, theoreticians have provided to replace quartz oscillators with micro-electromechanical systems (MEMS), for example, bulk mode resonators.

Figure 1A:
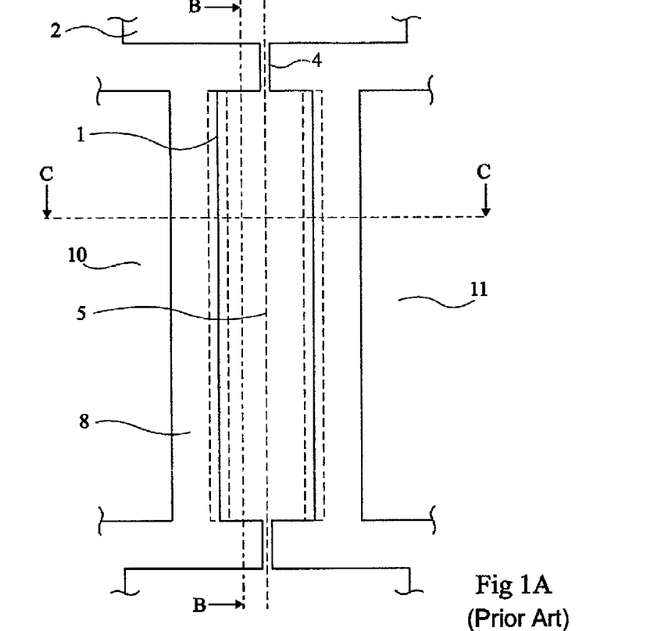
FIGS. 1A, 1B, and 1C illustrate a known bulk mode resonator.
Figure 1B:
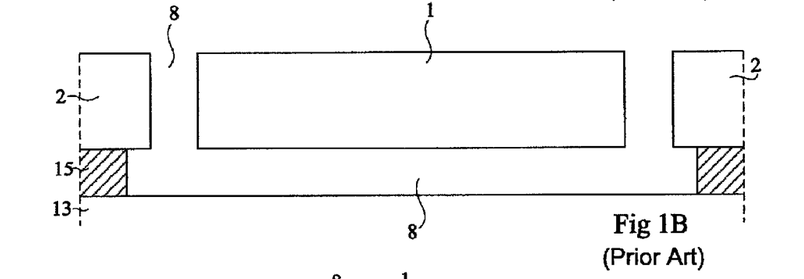
Figure 1C:
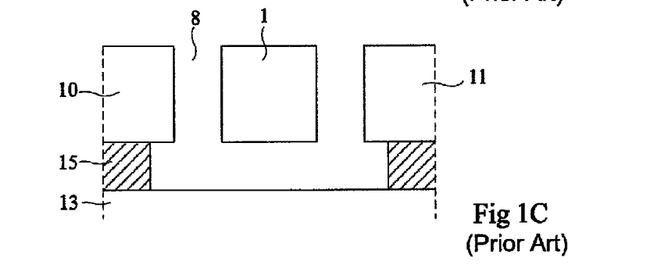

FIG. 1A is a partial simplified top view of a bulk mode resonator. FIGS. 1B and 1C are cross-section views along planes B-B and C-C.

The resonator comprises a resonant element 1 generally formed of a portion of a single-crystal or poly-crystal semiconductor material, for example, having the shape of a bar of rectangular cross-section. Element 1 is attached to at least one anchor area 2 by arms 4. Arms 4 are arranged to contact element 1 at the level of its vibration nodes. Arms 4 are aligned along a neutral vibration line 5 of element 1 illustrated in dotted lines.

Apart from its connection with arms 4, element 1 is surrounded with an empty space 8. Two electrodes 10 and 11 are placed symmetrically in front of element 1 on either side of neutral line 5.

Cross-section plane B-B is parallel to neutral line 5 and does not cross arms 4. Cross-section plane C-C is perpendicular to plane B-B and cuts element 1 and electrodes 10 and 11.

As illustrated in FIGS. 1B and 1C, the resonator is formed in a thin single-crystal silicon layer resting on a silicon wafer 13 with an interposed insulating layer 15. The portion of space 8 separating element 1 from support 13 results from the partial removal of insulator 15. Element 1, anchors 2, and electrodes 10 and 11 are formed in the thin layer.

The resonator operates as follows. Element 1 is at least partially made of a conductive material set to a first voltage and electrodes 10 and 11 are set to a second voltage. The voltage difference between element 1 and electrodes 10 and 11 creates electrostatic forces which cause a deformation of element 1. Element 1 then enters a mode of bulk vibration at its resonance frequency, which corresponds to a bulk wave oscillation around central neutral line 5 of element 1. The deformation of element 1 causes a variation of the capacitance of the capacitor formed by element 1 and electrodes 10 and 11. This capacitance variation may be detected at the level of electrode 10 or 11.

Theoretically, it is thus possible to obtain resonators having resonance frequencies which vary within a range from between 10 and 300 MHz up to between 1.5 and 3 GHz.

Such resonators have the theoretical advantages of having lower power consumption levels than quartz oscillators and of being easily integrable.

In practice, the use of such bulk mode resonators, especially as time bases, comes against various limitations. In particular, uncontrollable variations of the effective resonance frequency with respect to the desired nominal frequency can be observed. The observed variations typically range within a range from 5 to 10% of the value of the desired frequency, randomly below or above this frequency.

Resonators having high frequencies greater than some hundred megahertz are particularly desired for time bases placed in portable devices such as telephones or computers. In such devices, a drift of the nominal frequency is unacceptable.

Various solutions have been provided to overcome the drift of the effective frequency of a bulk mode resonator with respect to a desired frequency.

A solution comprises performing an electric correction of the frequency, especially by modifying the bias voltage of element 1. This solution only enables correcting the frequency value by a few ppm/V. This is insufficient to correct the observed 5 to 10% drift or requires unrealistic bias levels for battery-powered devices.

Another solution comprises using the frequency-vs.-temperature variation property. Thus, a filament is deposited on the resonant element to modify—that is, decrease—the frequency. Such a solution is not satisfactory since the heating of the filament increases the device power consumption, which is not desirable in the case of battery-powered devices.

Other solutions comprise modifying the mass of element 1.

To decrease this mass, part of the body of element 1 may be vaporized by means of a laser. This correction is relatively complex to implement since it imposes using dedicated equipment which does not belong to devices currently used in the manufacturing of MEMS. The increased complexity and cost of this solution make it inapplicable in an industrial environment.

To increase the mass, it has been provided to submit element 1 to an ion bombarding. However, this solution lacks flexibility since it needs to be implemented before the device packaging.

All these solutions come up against the problem of predicting the occurrence and the extent of the drift, which can at least for the most part be imputed to the fact that the nominal conditions are not achieved and that the conditions of implementation of the previously-described manufacturing method are not easily repeated. In particular, in the definition of resonant element 1 by etching of the thin layer on insulator, from one batch to another, fluctuations of the composition of the etch medium or of its exposure time may occur, which results in a modification of the dimensions of element 1. Such fluctuations and others, which would seem to be negligible, combine to modify the frequency, which essentially depends on the dimensions, on the density, and on the Young's modulus of element 1.

SUMMARY OF THE INVENTION

At lest one embodiment of the present invention aims at providing bulk mode resonator structures and methods for manufacturing them which at least partly overcome the disadvantages of known methods and devices.

In particular, the present invention aims at providing methods for manufacturing such resonators so that the oscillation frequency of the resonator is equal to a desired nominal value with an accuracy better than from 0.01 to 1%.

Generally, the inventors provide deliberately introducing a distortion, that is, a frequency increase by decreasing the mass and the dimensions of the resonant element. Then, the effective frequency is measured and compared with the nominal frequency. The possible observed difference is then compensated for by increasing the mass and the dimensions of the resonant element again.

Thus, an embodiment of the present invention provides a method for forming a resonator comprising a resonant element, the resonant element being at least partly formed of a body at least partly formed of a first conductive material, the body comprising open cavities, this method comprising the steps of:

measuring the resonator frequency; and at least partially filling said cavities.

According to an embodiment of the present invention, at least some of the open cavities are wells dug in at least a portion of the thickness of the resonant element.

According to an embodiment of the present invention, the first material is porous, at least some of the cavities being formed by open pores.

According to an embodiment of the present invention, the filling step is performed after a cap has been installed.

According to an embodiment of the present invention, the material for filling the cavities is selected from among silicon, germanium, silicon-germanium, ruthenium, iridium, platinum, zinc selenide, silicon oxide, aluminum, titanium, zinc and hafnium oxides, silicon nitride, titanium, tantalum, tungsten, and niobium nitrides, silicon oxynitride, and zinc sulfide.

According to an embodiment of the present invention, the method further comprises a step of forming, in the body, of columns of a material having a Young's modulus with a temperature coefficient of a sign opposite to that of the first material.

The present invention also provides a resonator comprising a resonant element comprising a body at least partly formed of a first conductive material, the body comprising open cavities, the cavities being at least partially filled with a second material.

According to an embodiment of the present invention, the resonator is a bulk mode resonator.

According to an embodiment of the present invention, the body comprises columns of a material having a variation coefficient of its Young's modulus according to temperature of a sign opposite to that of the first material.

According to an embodiment of the present invention, the first material is porous, at least part of the cavities being formed of pores.

The foregoing objects, features, and advantages of the present invention will be discussed in detail in the following non-limiting description of specific embodiments in connection with the accompanying drawings.

DETAILED DESCRIPTION

For clarity, as usual in the representation of microsystems, the various drawings are not to scale.

Figure 2A:
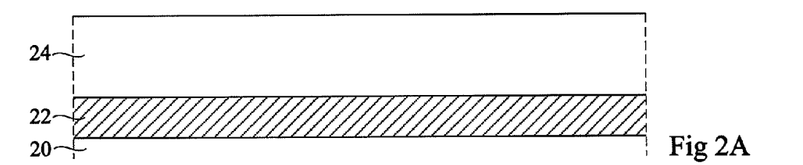
FIGS. 2A to 2C are partial simplified cross-section views which illustrate first successive steps of a method for manufacturing a bulk mode resonator according to an embodiment of the present invention.
Figure 2B:
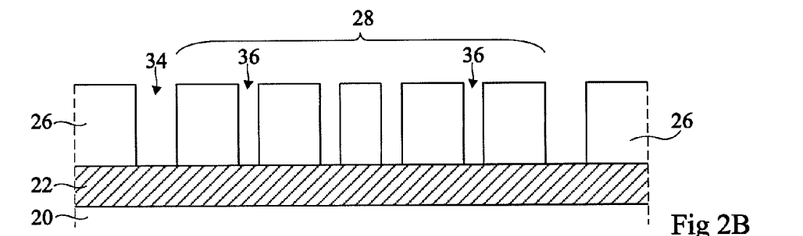
Figure 2C:
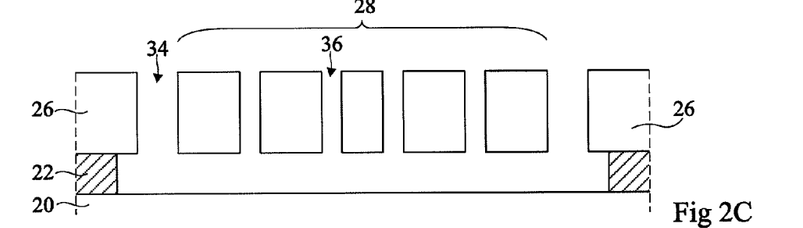

FIGS. 2A to 2C are cross-section views along a same cross-section plane as FIG. 1B illustrating as an example first steps of a bulk-mode resonator manufacturing method.

As illustrated in FIG. 2A, it is started from a semiconductor wafer of silicon-on-insulator type in which an insulator 22 separates a wafer 20 of a semiconductor material from a thin single-crystal layer 24 of another semiconductor material doped to be conductive.

As illustrated in FIG. 2B, the contours of anchor areas 26, of a resonant element 28, and of electrodes (30 and 32, FIG. 3) are first defined on layer 24 by the digging of trenches 34.

According to an embodiment, in the portion of layer 24 intended to form resonant element 28, cavities 36 are also dug. Cavities 36 are open, that is, they comprise an opening on a surface of resonant element 28.

According to an embodiment, as shown, cavities 36 are through. Trenches 34 and cavities 36 are then formed across the entire thickness of layer 24 down to insulator 22. Trenches 34 and cavities 36 may be formed with a same mask.

As illustrated in FIG. 2C, layer 22 is removed, which enables releasing resonant element 28 of the resonator. During this removal, buried insulator 22 is at least partly maintained under electrodes 30 and 32. Element 28 can then vibrate in the empty space defined by trenches 34 and the removal of insulator 22.

Figure 3:
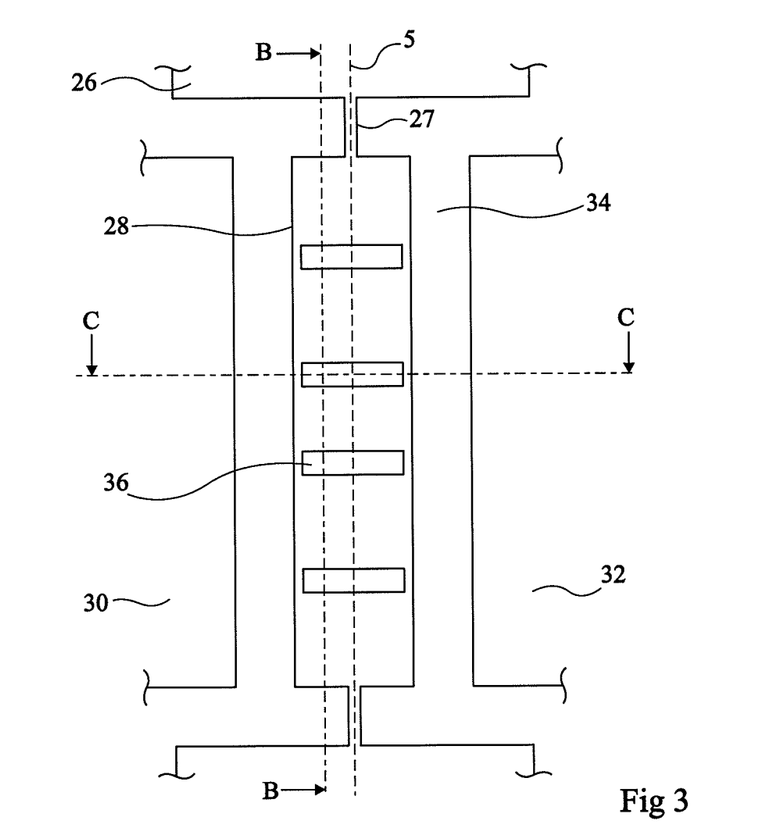
FIG. 3 is a top view of the resonator of FIG. 2C.
Figure 4:
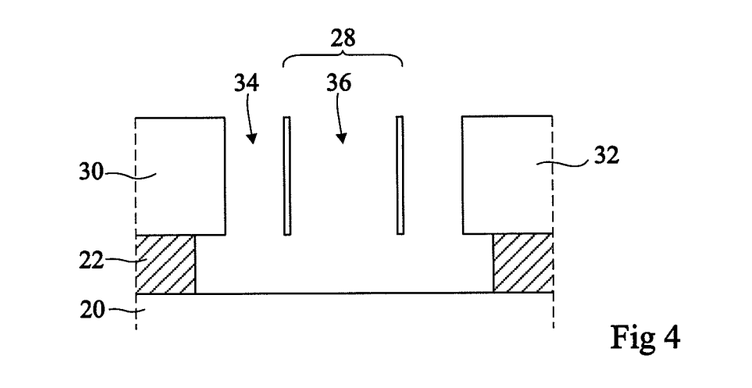
FIG. 4 is a cross-section view along plane C-C of FIG. 3.

As illustrated in the cross-section view of FIG. 2C, the top view of FIG. 3, and the cross-section view of FIG. 4, cavities 36 are homogenously distributed in element 28. Preferably, cavities 36 are excluded from a peripheral region of element 28. Each cavity 36 extends perpendicularly to the neutral line 5 that it crosses. As a variation, not shown, each cavity 36 may be divided into a plurality of cavities. Cavities 36 may also be excluded from a median area which extends symmetrically around neutral line 5. Cavities 36 are then preferably formed symmetrically on either side of the median area.

It has been considered in relation with FIG. 2B that cavities 36 are formed at the same time as or immediately after trenches 34. It should however be noted that cavities 36 may be dug at a subsequent stage, especially when cavities 36 do not cross the entire thickness of layer 24. For example, cavities 36 may be dug after the forming across the entire thickness of thin layer 24, in the area where element 28 is formed, of columns of a material having a Young's modulus with a TCE coefficient of a sign opposite to that of the material forming layer 24.

According to an embodiment, the material forming thin layer 24 is a porous material, and the specific forming of cavities 36 described in relation with FIG. 2B is not implemented. Cavities 36 may then be formed by the pores of the material only. As described previously, cavities 36, and thus the pores, should be open on a surface of element 28. According to an embodiment, the pores cross the entire thickness of layer 24.

In the following description, second steps of a method for manufacturing a bulk mode resonator will be described. These second steps will be implemented from a structure similar to that of FIGS. 2C, 3, and 4, that is, a structure in which resonant element 28 comprises open cavities 36, whether these cavities 36 cross or not the entire thickness of element 28 and/or whether they result from the digging of thin layer 24 or from the presence of pores or again from a combination thereof.

According to an embodiment, the second steps start with a test of measurement of the resonance frequency of element 28. Such a test is already currently implemented to reject devices exhibiting a frequency drift greater than a given threshold and requires no additional specific tooling. This test enables to determine the distance from the effective frequency to the desired frequency.

Figure 5A:
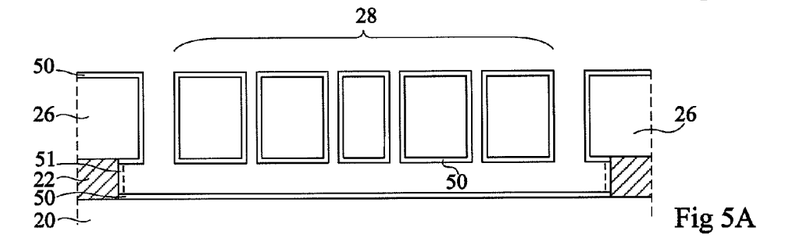
FIGS. 5A and 5B are partial simplified cross-section views which illustrate second successive steps of a method for manufacturing a bulk mode resonator according to an embodiment of the present invention.
Figure 5B:
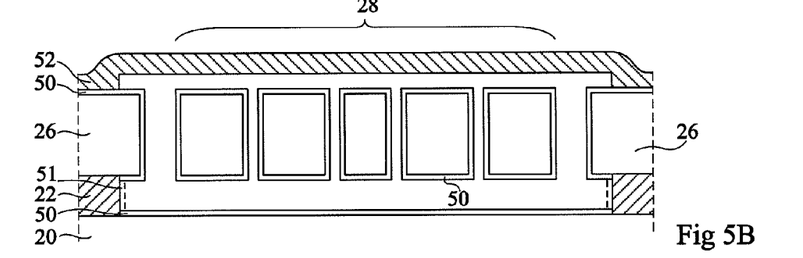

According to an embodiment described in relation with the cross-section views of FIGS. 5A and 5B, the test step is followed by the forming of a thin layer 50 on the apparent portions of layer 24, in particular on the walls of open cavities 36 and around element 28. If this deposition is conformal, it leads to the forming of a portion 51 of layer 50, shown in dotted lines, on the apparent vertical portions of insulating layer 22. Thus, if the material of layer 50 is conductive, the deposition mode will be selected to avoid the forming of portions 51 to prevent any short-circuit. For example, if the body is made of a semiconductor material, layer 50 will be formed of a semiconductor deposited by selective epitaxy on the semiconductor portions only and not on insulating portions 22.

As illustrated in FIG. 5A, according to an embodiment, cavities 36 are only partially filled by the growth of layer 50 on their walls.

According to another embodiment, not shown, cavities 36 are totally filled by the growth of layer 50. The filling is performed so that no air bubble remains trapped.

The nature and the thickness of layer 50 are selected according to the result of the test for measuring the frequency interval to combine the effect of the increase of the mass and of the dimensions of element 28 as well as a possible variation of the Young's modulus to reach the desired frequency value.

Then, the method carries on as illustrated in the cross-section view of FIG. 5B by steps of forming of a cap 52 and the forming of contacts (not shown).

Figure 6A:
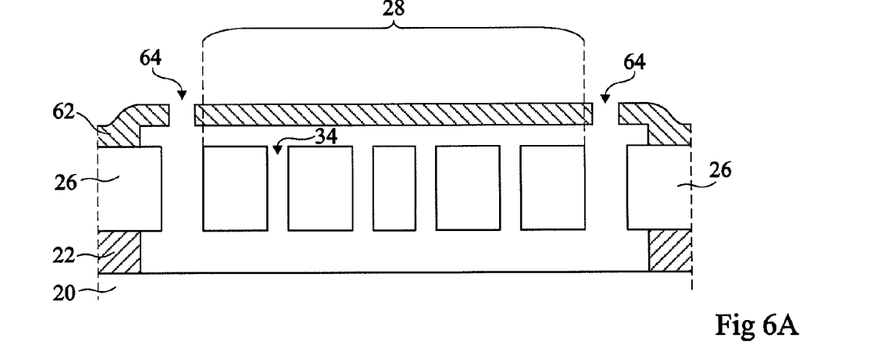
FIGS. 6A to 6C are partial simplified cross-section views which illustrate second successive steps of a method for manufacturing a bulk mode resonator according to another embodiment of the present invention.
Figure 6B:
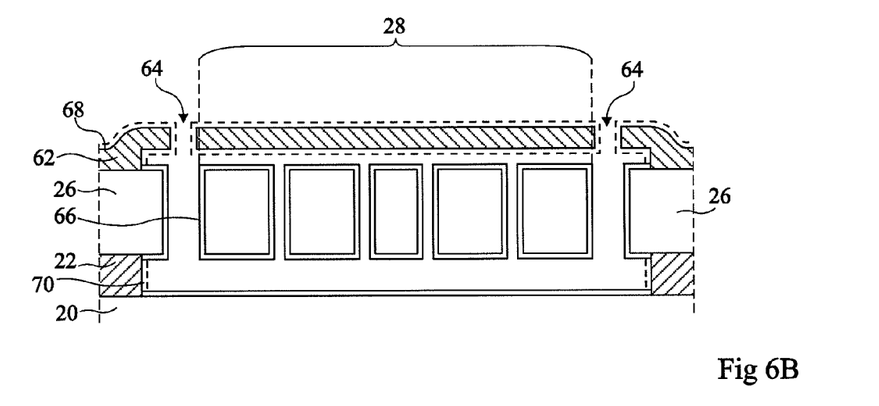
Figure 6C:
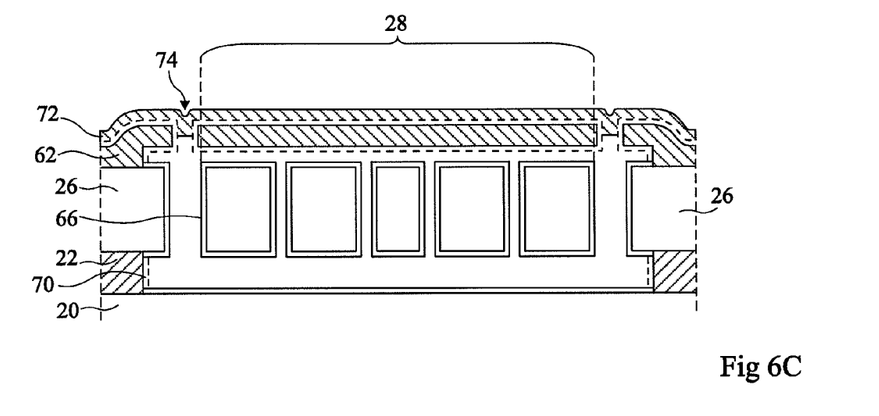

According to another embodiment, the second steps previously described in relation with FIGS. 5A and 5B are replaced with the second steps described in relation with the cross-section views of FIGS. 6A, 6B, and 6C.

According to an embodiment, the second steps start again by a test of measurement of the effective resonator frequency and by the determination of its drift with respect to the desired frequency.

As illustrated in FIG. 6A, the resonator comprising the element 28 at least partially crossed by cavities 36 is then provided with a cap 62. Openings 64 are formed in cap 62 to provide access to the area in which resonant element 28 is located.

Then, as illustrated in FIG. 6B, a deposition is performed to form a thin layer 66, at least on the apparent portions of layer 24 forming element 28, especially on the walls of open cavities 36. Thin layer 66 is similar to layer 50 of the previous embodiment and obeys the same deposition constraints. In the case where layer 66 is formed by the conformal deposition, layer 66 comprises layer portions 68 on cap 62 and layer portions 70 on layer 20, as illustrated in dotted lines. Layer portions 68 and 70 have no incidence upon the device operation if the material of layer 66 is insulating. However, if it is conductive, the deposition mode of layer 66 will be selected to avoid the forming of layer portions 68 and 70 to exclude the forming of a short-circuit between anchors 26 and electrodes 30 and 32.

The method carries on, as illustrated in FIG. 6C, by the deposition of a sealing material 72 capable of forming plugs 74 at the locations of openings 64 to seal cap 62. The method ends with steps of forming of contacts with anchors 26 and electrodes 30 and 32.

According to a variation, the second steps start with the placing of cap 62 and only after this is the test step implemented. For this purpose, openings are formed in cap 62 at the level of electrodes 30, 32 and of anchors 26. Once the test has been performed, openings 64 have been formed, layer 66 has been deposited, and cap 62 has been sealed by layer 72.

An advantage of the provided manufacturing methods is that they use a standard SOI substrate in which the thickness of insulator 22 ranges between 100 nm and 3 μm, and typically is on the order of 1 μm. Similarly, all the layers used have dimensions compatible with standard technological processes.

Another advantage is that the possible correction range is much wider and more accurate than with known solutions and this, without using complex devices.

Another advantage is that the correction can be performed before as well as after the installation of the cap. In particular, if a drift in the nominal frequency occurs due to thermal processings linked to the installation of a cap, this drift may be compensated for after the packaging.

As an example, the dimensions and natures of the different layers are the following:
- wafer 20 is a single-crystal silicon wafer, for example, having a thickness ranging between 300 and 720 μm;
- insulator 22 is a silicon oxide layer having a thickness ranging between 100 nm and 3 μm, for example, 1 μm;
- layer 24 is a single-crystal silicon layer of a thickness ranging between 1 and 20 μm, for example, 3 μm; at least in the forming area of element 28, layer 24 is porous, the pores being for example through and having a diameter ranging from 10 nm to 1 μm;
- open cavities 36 have a width or a diameter of at most 1 μm; preferably, the width of the openings is reduced to the minimum possible value allowed by the methods for etching layer 24; the number of cavities 36 is such that a proportion from 0.25 to 40% of the mass of the portion of layer 24 forming element 28 is removed; it should be noted that in the case where element 28 comprises columns of a material having a variation coefficient of its Young's modulus of a sign opposite to that of the material forming layer 24, cavities 36 are formed outside of these columns; and
- layer 50 or 66 then has a thickness ranging between 0 and 500 nm.

Layer 50 or 66 is for example formed of the same semiconductor material as layer 24 or of another semiconductor material that may be deposited on layer 24 by epitaxy, for example, of the silicon, germanium, or silicon-germanium. It may also be a conductive material such as ruthenium, iridium, platinum, or zinc selenide. Layer 50 or 66 may also be an insulating layer, for example, a metal oxide layer—such as an aluminum, silicon, titanium, zinc, or hafnium oxide—or a silicon, titanium, tantalum, tungsten, or niobium nitride layer, or again an insulating silicon oxynitride or zinc sulfide layer.

If the portion of layer 24 forming element 28 is porous, the material selected to form layer 50 or 66 is preferably capable of being deposited in the pores without clogging them, for example, by epitaxy or by an atomic layer deposition method (ALD).

Specific embodiments of the present invention have been described. Various alterations and modifications will occur to those skilled in the art. Thus, it should be understood by those skilled in the art that the present invention has been described in the case of a silicon technology. However, layer 24 may be made of another semiconductor single-crystal or polycrystalline material. In particular, layer 24 may be a stressed silicon-germanium layer, a germanium layer, or a layer of any other material or semiconductor alloy such as gallium arsenide. Layer 24 may also be made of a semiconductor material with a wide bandgap, such as silicon carbide (SiC) or diamond carbide.

Layer 24, or at least its portion in which resonant element 28 is formed, may be made of a porous form of one of the previously-discussed materials. According to an embodiment, at least part of the pores are through. For example, layer 24 is made of mesoporous or macroporous silicon having pores with a diameter ranging from 100 nm to 1 μm.

The structure of the resonant element is not limited to the shown rectangular shape. The resonant element may be a plate attached to at least one anchor by an arm. Preferably, the open cavities then extend radially along the extension/compression direction of the element. They are regularly distributed outside of a peripheral exclusion area centered on the vibration node formed by the geometric center of the plate.

Similarly, the resonant element may be a disk formed of a single-crystal semiconductor body. The trenches are then distributed around the node formed by the center of the disk. The cavities are arranged radially so that their possible largest dimension in top view is parallel to the propagation direction of the bulk waves, avoiding the peripheral exclusion area.

Thus, the resonator may comprise an element having a great variety of shapes. It will be within the abilities of those skilled in the art to adapt the position of the cavities according to what has been described previously so that they extend, outside of a peripheral exclusion area, symmetrically around a node or a neutral vibration line. Preferably, the cavities extend radially along the bulk wave propagation direction.

The resonator may also be made of a non-semiconductor material but will have to be at least partially conductive.

Dimensions have been indicated herein in the context of a given technological process. It will be within the abilities of those skilled in the art to adapt the dimensions of the different elements according to the manufacturing constraints.

It will also be within the abilities of those skilled in the art to form partially or totally filled cavities in any type of resonator.

It will also be within the abilities of those skilled in the art to complete the method, if necessary, with currently-implemented steps. Thus, instead of using the portions 30 and 32 of the substrate facing element 28 as electrodes, it will be within the abilities of those skilled in the art to develop electrodes bearing on these substrate portions with a reserved empty space between the electrodes and element 28. The substrate portions can then be used as a simple support or to take electrode contacts. The electrodes may overhang a small peripheral portion of element 28.

It has further been considered in the foregoing description that the body of the resonant element is at least partially formed of a conductive material. In this case, the body can be directly biased and is used as an actuator and/or as a detector. However, it will be within the abilities of those skilled in the art to use a body made of a non-conductive material by associating an actuator and/or a detector thereto.

Moreover, it will be within the abilities of those skilled in the art to adapt the materials used to a given manufacturing process.

Further, the present invention has been described as applied to bulk mode resonators. However, the forming in the body of a microsystem of open, through or non-through cavities, which may be partially or totally filled with a material capable of compensating for a frequency drift, may be used in all other types of resonators, such as flexion-mode resonators, and more generally in any type of microsystem.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for adjusting a resonance frequency of a resonator comprising a resonant element, wherein the resonant element is at least partly formed of a body at least partly formed of a first conductive material, the body comprising open cavities, comprising the successive steps of:
    measuring the resonator frequency; and
    at least partially filling said cavities for adjusting the resonance frequency.

2. The method of claim 1, wherein at least some of the open cavities are wells dug at least in a portion of the thickness of the resonant element.

3. The method of claim 1, wherein the first material is porous, at least some of the cavities being formed by open pores.

4. The method of claim 1, wherein the filling step is performed after a cap has been installed.

5. The method of claim 1, wherein the material for filling the cavities is selected from among silicon, germanium, silicon-germanium, ruthenium, iridium, platinum, zinc selenide, silicon oxide, aluminum, titanium, zinc, and hafnium oxides, silicon nitride, titanium, tantalum, tungsten, and niobium nitrides, silicon oxynitride and zinc sulfide.

6. The method of claim 1, further comprising a step of forming, in the body, columns of a material having a Young's modulus with a temperature coefficient of a sign opposite to that of the first material.

7. A resonator comprising a resonant element comprising a body at least partly formed of a first conductive material, the body comprising open cavities, the cavities being at least partially filled with a second material, wherein the first conductive material is porous and at least part of the cavities are formed of pores.

8. The resonator of claim 7, wherein the resonator is a bulk mode resonator.

9. The resonator of claim 7, wherein the body comprises columns of a material having a variation coefficient of its Young's modulus according to temperature of a sign opposite to that of the first material.

10. The resonator of claim 7, further comprising electrodes for exciting the resonant element.

11. The resonator of claim 7, wherein at least some of the open cavities are wells formed at least into a portion of a thickness of the resonant element.

12. The resonator of claim 7, wherein at least some of the open cavities are wells formed through a thickness of the resonant element.

13. The resonator of claim 7, wherein the second material comprises a material selected from the following list: silicon, germanium, silicon-germanium, ruthenium, iridium, platinum, zinc selenide, silicon oxide, aluminum, titanium, zinc, and hafnium oxides, silicon nitride, titanium, tantalum, tungsten, and niobium nitrides, silicon oxynitride, and zinc sulfide.

14. The resonator of claim 7, wherein the resonant element is formed in a semiconductor layer adjacent an insulating layer on a semiconductor-on-insulator substrate.

15. The resonator of claim 7, wherein the resonant element has a thickness between 1 micron and 20 microns.

16. The resonator of claim 7, wherein the open cavities remove between 0.25% and 40% of the mass of the resonant element.

17. The resonator of claim 7, wherein the resonant element is formed in a single crystal semiconductor material or polycrystalline semiconductor material.

18. The resonator of claim 17, wherein the semiconductor material comprises a semiconductor selected from the following list: silicon, silicon-germanium, germanium, gallium-arsenide, and silicon-carbide.

19. The resonator of claim 7, wherein the resonant element is rectangular.

20. The resonator of claim 7, wherein the resonant element is shaped as a plate and the open cavities extend radially.

21. The resonator of claim 7, wherein the resonant element is shaped as a disk and the open cavities extend radially.

22. The resonator of claim 7, wherein the open cavities have a largest dimension that is parallel to a propagation direction of bulk waves in the resonant element.

23. The resonator of claim 7, further comprising a cap that at least partially encloses the resonator.

24. The resonator of claim 23, further comprising holes in the cap.

25. The resonator of claim 23, further comprising holes in the cap that have been plugged with a sealing material.

26. A method comprising:
measuring a resonator frequency of a microfabricated bulk mode resonator; and
at least partially filling open cavities in a resonant element of the bulk mode resonator responsive to measuring the resonator frequency.

27. The method of claim 26, further comprising filling the open cavities until the bulk mode resonator vibrates with a desired resonance frequency.

28. The method of claim 26, further comprising forming the resonant element in an insulated semiconductor layer of a semiconductor-on-insulator wafer.

29. The method of claim 28, further comprising forming the open cavities.

30. The method of claim 28, further comprising forming at least one electrode for exciting the resonant element.

31. The method of claim 30, wherein at least partially filling the open cavities comprises selectively depositing a material so as to avoid an electrical shorting of an electrode of the bulk mode resonator.

32. The method of claim 28, further comprising forming a cap to at least partially enclose the resonant element.

33. The method of claim 32, wherein the partially filling of the open cavities is performed after the forming of the cap.

34. The method of claim 32, further comprising filling holes in the cap with a sealing material.

35. The method of claim 26, wherein the open cavities are pores or wells formed in the resonant element.

36. The method of claim 26, wherein at least some of the open cavities are wells formed at least in a portion of a thickness of the resonant element.

37. The method of claim 26, further comprising forming, in the resonant element, columns of a material having a Young's modulus with a temperature coefficient of a sign opposite to that of a bulk material in which the resonant element is formed.

38. The method of claim 26, wherein the material for filling the open cavities comprises a material selected from the following list: silicon, germanium, silicon-germanium, ruthenium, iridium, platinum, zinc selenide, silicon oxide, aluminum, titanium, zinc, and hafnium oxides, silicon nitride, titanium, tantalum, tungsten, and niobium nitrides, silicon oxynitride, and zinc sulfide.

* * * * *

UNITED STATES PATENT AND TRADEMARK OFFICE
CERTIFICATE OF CORRECTION

PATENT NO. : 8,519,806 B2
APPLICATION NO. : 12/794037
DATED : August 27, 2013
INVENTOR(S) : Fabrice Casset et al.

It is certified that error appears in the above-identified patent and that said Letters Patent is hereby corrected as shown below:

In the Claims

Claim 1, col. 8, line 21 should read:
element is at least partly formed of a body at least partly formed Signed and Sealed this
Twelfth Day of November, 2013

Teresa Stanek Rea
*Deputy Director of the United States Patent and Trademark Office*